United States Patent
Partovi et al.

(10) Patent No.: US 8,497,721 B1
(45) Date of Patent: Jul. 30, 2013

(54) PASS GATE SHADOW LATCH

(75) Inventors: Hamid Partovi, Los Altos, CA (US);
Alfred Yeung, Fremont, CA (US); John Ngai, Boxborough, MA (US); Ronen Cohen, Sunnyvale, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 91 days.

(21) Appl. No.: 13/160,569

(22) Filed: Jun. 15, 2011

(51) Int. Cl.
*H03K 3/289* (2006.01)

(52) U.S. Cl.
USPC .......................... 327/202; 327/199; 327/203

(58) Field of Classification Search
USPC .......................................... 327/199, 202, 203
See application file for complete search history.

(56) References Cited

U.S. PATENT DOCUMENTS

| | | | |
|---|---|---|---|
| 3,585,410 A | 6/1971 | Burtness | |
| 4,980,577 A | 12/1990 | Baxter | |
| 5,248,905 A | 9/1993 | Kuo | |
| 5,986,962 A | 11/1999 | Bertin et al. | |
| 6,278,308 B1 | 8/2001 | Partovi et al. | |
| 6,433,601 B1 | 8/2002 | Ganesan | |
| 6,657,471 B1 | 12/2003 | Curran et al. | |
| 7,027,345 B2 | 4/2006 | Nedovic et al. | |
| 7,278,074 B2 * | 10/2007 | Mitra et al. | 714/724 |
| 7,525,362 B1 | 4/2009 | Lesea et al. | |
| 7,692,466 B2 | 4/2010 | Ahmadi | |
| 7,772,906 B2 | 8/2010 | Naffziger | |
| 7,843,244 B1 | 11/2010 | Tang et al. | |
| 2008/0042713 A1 | 2/2008 | Ahmadi | |
| 2008/0180139 A1 | 7/2008 | Natonio et al. | |
| 2009/0085627 A1 | 4/2009 | Gill et al. | |
| 2009/0256609 A1 | 10/2009 | Naffziger | |
| 2011/0025394 A1 | 2/2011 | Tang et al. | |

* cited by examiner

*Primary Examiner* — John Poos
(74) *Attorney, Agent, or Firm* — Turocy & Watson, LLP

(57) ABSTRACT

A latch device is provided with a relay and a shadow latch. The relay has an input to accept a binary relay input signal, an input to accept a clock signal, an input to accept a shadow-Q signal, and an output to supply a binary Q signal value equal to the relay input signal value. The relay output is supplied in response to the relay input signal, the shadow-Q signal, and the clock signal. The shadow latch has an input to accept the relay input signal, an input to accept the clock signal, and an output to supply the shadow-Q signal with a value equal to an inverted Q signal value. The shadow latch output is supplied in response to the relay input signal and clock signal.

20 Claims, 9 Drawing Sheets

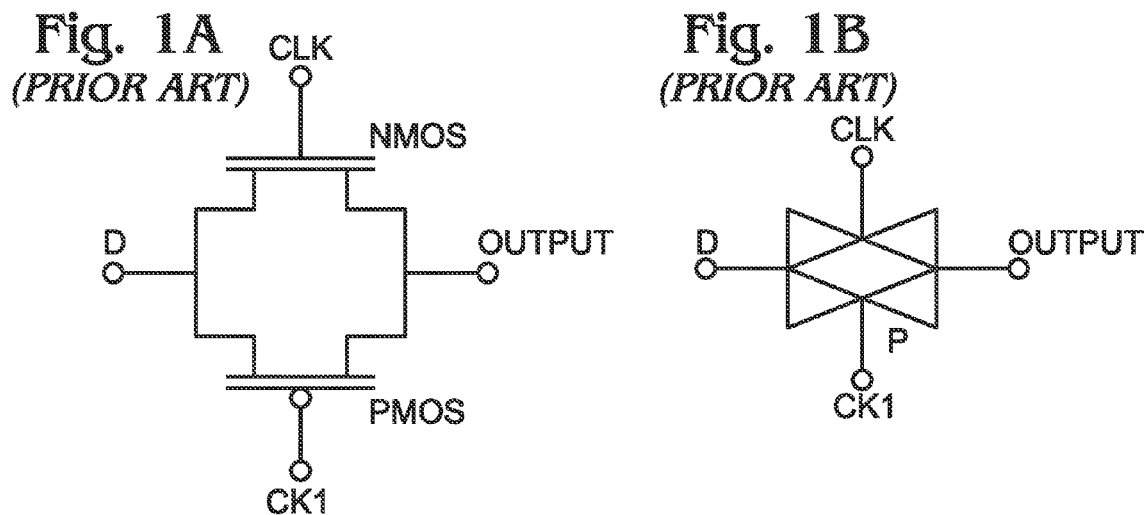
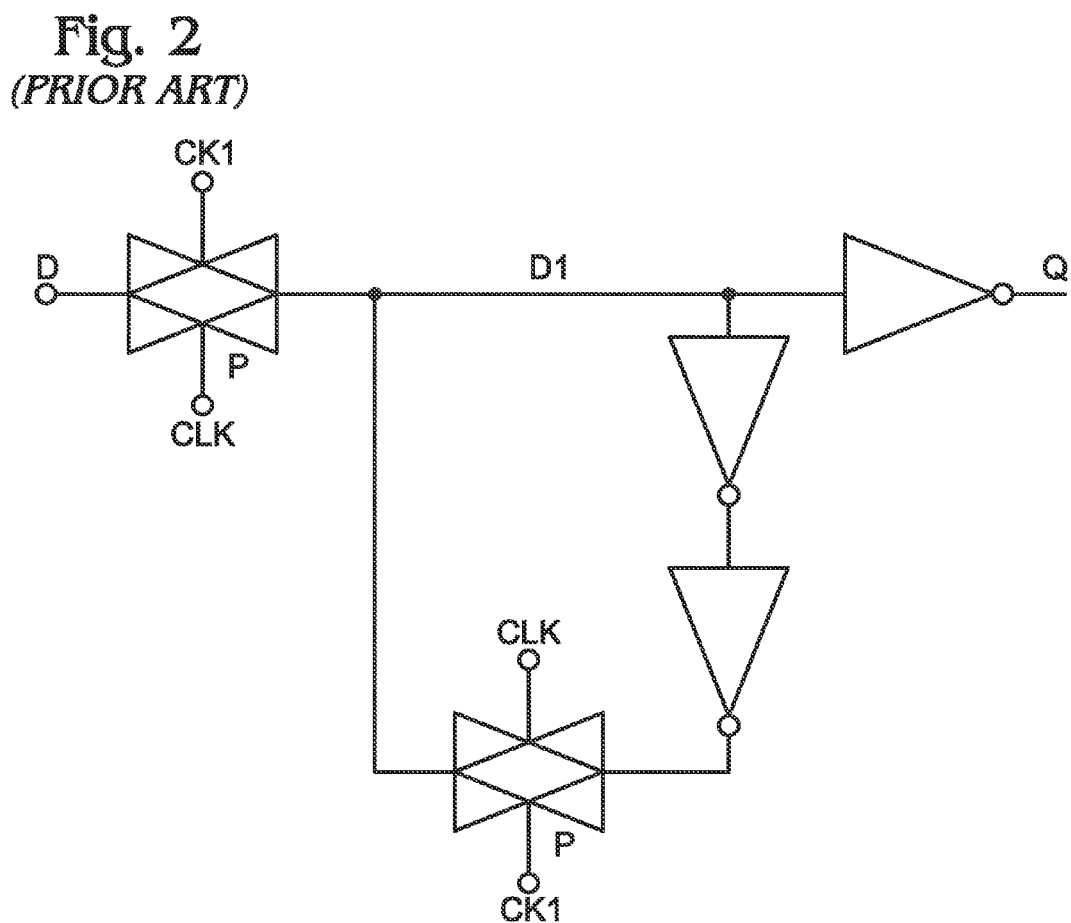

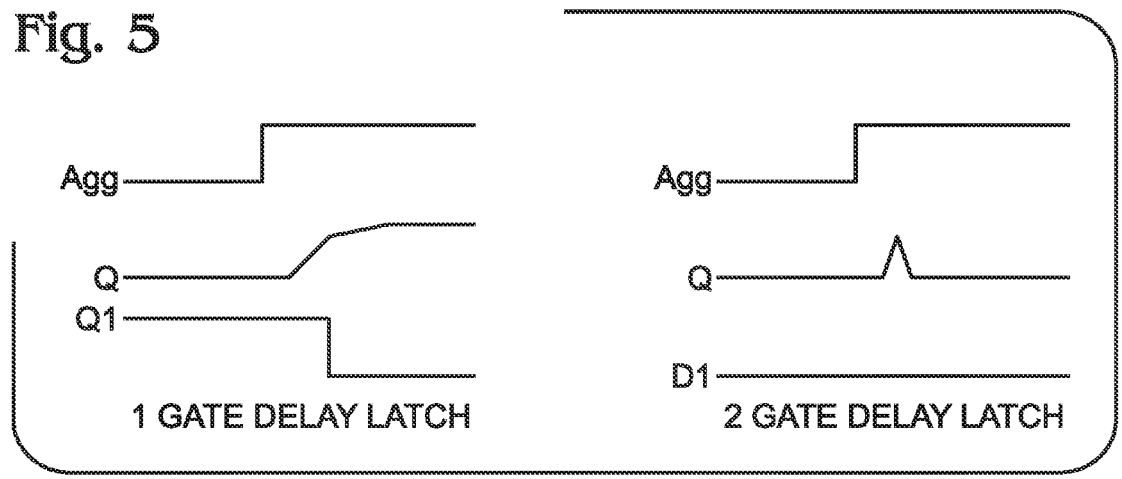
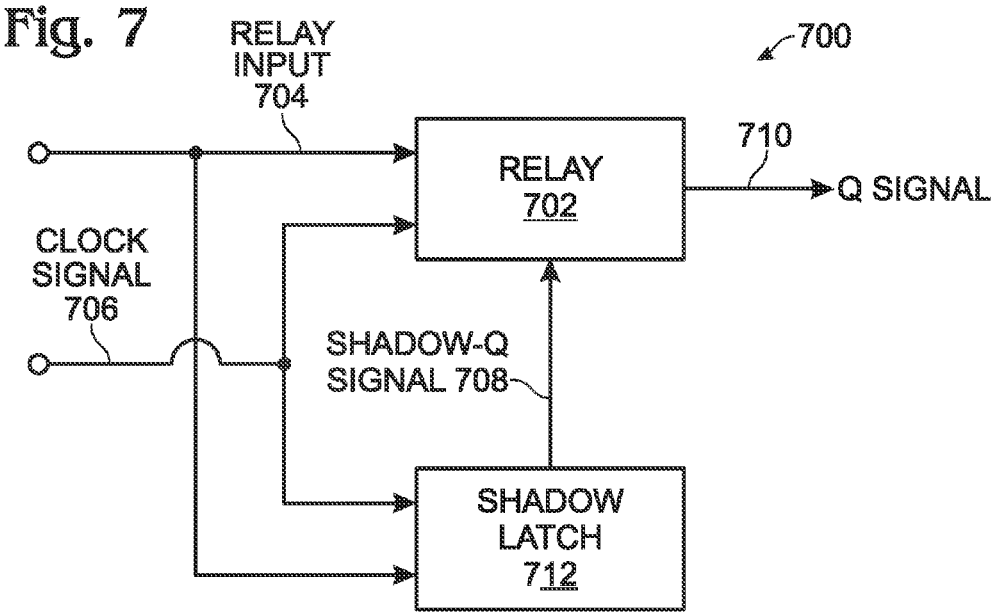

PASS GATE SHADOW LATCH

BACKGROUND OF THE INVENTION

1. Field of the Invention

This invention generally relates to electronic circuitry and, more particularly, to a one-gate delay latch with a shadow stage, which is immune from corruption, to support the latch in its opaque (hold) phase.

2. Description of the Related Art

Whether it is a phase-based design implemented with latches as a fundamental memory element, or edge-based design implemented with back-to-back latches (flip-flops) as the fundamental memory element, latches are an essential building block in modern very large scale integration (VLSI) designs. With conflicting properties of delay, area, power, and robustness, it is difficult to design latches that satisfy all design requirements.

Latches are commonly used in VLSI designs either by themselves or as part of an edge-triggered Flip-Flop (FF) due to their memory holding function. A latch has two phases of operation: in the transparent phase, data flows freely from D to Q, and the amount of time for this to occur is its native delay (Tdq). In the opaque phase, data may toggle on the input D, but Q holds its previous value. Which phase the latch operates in is determined by the phase of the clock input. In the context of being a FF building block, there are setup time (Tsu) and clock delay (Tcq) characteristics of the FF. However, those two parameters together form the Tdq native delay, and it is useful to discuss this value as the metric for performance.

FIGS. 1A and 1B are schematic diagrams of a pass gate (prior art). As configured, when the clock signal (CLK) is low, the device is in a tri-state mode, meaning the output impedance is high. When CLK is high, the input signal (D) is passed to the output. Alternatively, the CLK signal can be connected to the gate of the PMOS transistor and the inverted CLK signal (CK1) connected to the gate of the NMOS transistor, in which case the input is passed when CLK is low. The device of FIG. 1A may also be depicted as shown in FIG. 1B.

FIG. 2 is a schematic diagram of a conventional latch design using pass gates (prior art). The latch is a clocked state element (from D to D1), which is protected from the output by an inverter (from D1 to Q). This design has the benefit of being simple to understand and extremely robust. However, it has two gate-delay elements, which limits its performance. Note: CLK and CK1 are opposite phases of a binary clock signal.

FIG. 3 is a schematic diagram of a conventional latch design with improved gate delay (prior art). As an alternative to the design of FIG. 2, the output inverter is removed to provide a faster Tdq. However, this design has a major flaw in that the memory state element is exposed to the output. The memory state is the output value maintained by pass gate 302, when pass gate 300 is in its opaque phase. When the memory state is protected by the inverter, as in FIG. 2, the effects of any external coupling effects are minimized. When the memory state is exposed, as in FIG. 3, uncontrolled external routes and coupling events can directly affect the feedback loop's ability to maintain the state. If this happens, the memory state becomes corrupted and irrecoverable.

FIG. 4 is a timing diagram contrasting the differences in delay between the circuits of FIG. 2 and FIG. 3. In terms of gate delay, the right-most figure, associated with the latch of FIG. 3, is one gate faster than the left-most figure, which is associated with the latch of FIG. 2.

FIG. 5 is a timing diagram depicting the differences in memory state corruption between the circuits of FIG. 2 and FIG. 3. The diagram illustrates a glitch event from external routing upon the output pin Q. If the state-node is exposed as in FIG. 3, an external aggressor net "Agg" can potentially flip the state of the latch (left-most figure). In the design of FIG. 2, a noise event can only produce a glitch on Q instead of flipping the state of the latch (right-most figure).

FIG. 6 is a schematic drawing of a conventional edge-triggered flip-flop using pass gates (prior art). Edge-triggered flip-flops are commonly used in high-performance synchronous designs due to their robustness and ease of use. A FF is made up of two latches, conventionally described as master and slave latches. As shown, each latch is based upon the design depicted in FIG. 2. Each of these latches is transparent in alternating clock phases, and this creates the functionality of a FF. The delay characteristics of a FF are described by its delay through the master latch (Tsu), the delay through the slave latch (Tcq) and hold time (Thd). Of the three characteristics, Tsu and Tcq are sometimes combined as the total FF delay (Tdq) to describe the overall delay characteristic of the FF.

The key elements of the flip-flop are its master latch state nodes (MS) and its slave latch state nodes (SS). The state nodes of latches are made up of clocked cross-coupled pass gates to provide a feedback loop. This feedback loop maintains the state of this memory element when the latch is opaque. Therefore, these state nodes must be carefully designed to prevent any noise related glitch event from corrupting the state of the latch.

It would be advantageous if a latch could be designed to combine the improved gate delay of the FIG. 3 circuit, with the noise immunity of the FIG. 2 circuit.

SUMMARY OF THE INVENTION

Disclosed herein is a latch that improves upon a conventional latch design by reducing its delay, without exposing critical memory state nodes to noise. This improvement is achieved at a small price in area and clock loading, while maintaining the conventional logic polarity. The latch permits the fabrication of high-performance design flip-flops, where timing is a critical requirement.

Accordingly, a latch device is provided with a relay and a shadow latch. The relay has an input to accept a binary relay input signal, an input to accept a clock signal, an input to accept a shadow-Q signal, and an output to supply a binary Q signal value equal to the relay input signal value. The relay output is supplied in response to the relay input signal, the shadow-Q signal, and the clock signal. The shadow latch has an input to accept the relay input signal, an input to accept the clock signal, and an output to supply the shadow-Q signal with a value equal to an inverted Q signal value. The shadow latch output is supplied in response to the relay input signal and clock signal.

More explicitly, the relay includes a first clocked pass gate circuit having an input to accept the relay input signal, an input to accept the clock signal, and an output to supply the Q signal in the pass mode. A first inverter accepts the shadow-Q signal and supplies an inverted shadow-Q signal. A second clocked pass gate circuit has an input to accept the inverted shadow-Q signal, an input to accept the clock signal, and an output to supply the Q signal in a hold mode.

The shadow latch includes a third clocked pass gate circuit having an input to accept the relay input signal, an input to accept the clock signal, and an output to supply a D1 signal in the pass mode. A second inverter has an input to accept the D1 signal and an output to supply the shadow-Q signal. A third inverter has an input to accept the shadow-Q signal and an output to supply an inverted shadow-Q signal. A fourth clocked pass gate circuit has an input to accept the inverted shadow-Q signal, an input to accept the clock signal, and an output to supply the D1 signal in the hold mode.

Additional details of the above-described latch device and a method for stabilizing an unbuffered latch are provided below.

BRIEF DESCRIPTION OF THE DRAWINGS

FIGS. 1A and 1B are schematic diagrams of a pass gate (prior art).

FIG. 2 is a schematic diagram of a conventional latch design using pass gates (prior art).

FIG. 5 is a timing diagram depicting the differences in memory state corruption between the circuits of FIG. 2 and FIG. 3.

FIG. 7 is a schematic block diagram of a latch device.

DETAILED DESCRIPTION

FIG. 7 is a schematic block diagram of a latch device. The latch device 700 comprises a relay 702 having an input on line 704 to accept a binary relay input signal, an input on line 706 to accept a clock signal, and an input on line 708 to accept a shadow-Q signal. The relay has an output on line 710 to supply a binary Q signal equal (in polarity) to the relay input signal. The supplied Q signal is responsive to the relay input signal, the shadow-Q signal, and the clock signal. A shadow latch 712 has an input on line 704 to accept the relay input signal, an input on line 706 to accept the clock signal, and an output on line 708 to supply the shadow-Q signal. The shadow-Q signal is equal (in polarity) to an inverted Q signal, and responsive to the relay input signal and clock signal.

Figure 3:
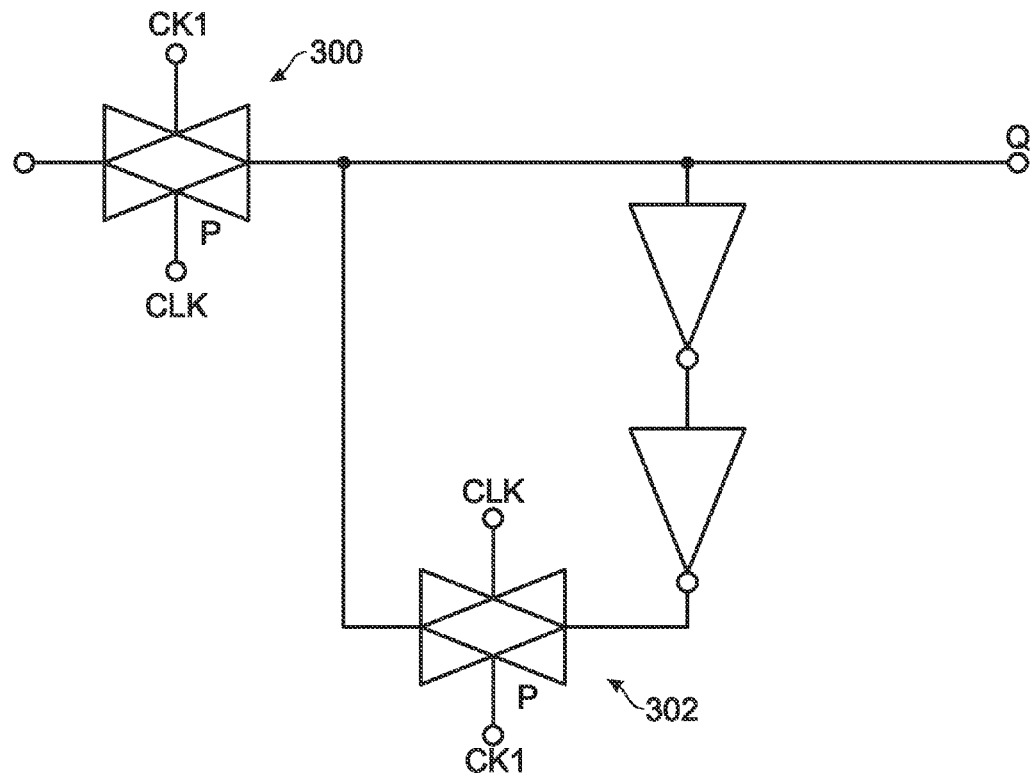
FIG. 3 is a schematic diagram of a conventional latch design with improved gate delay (prior art).
Figure 4:
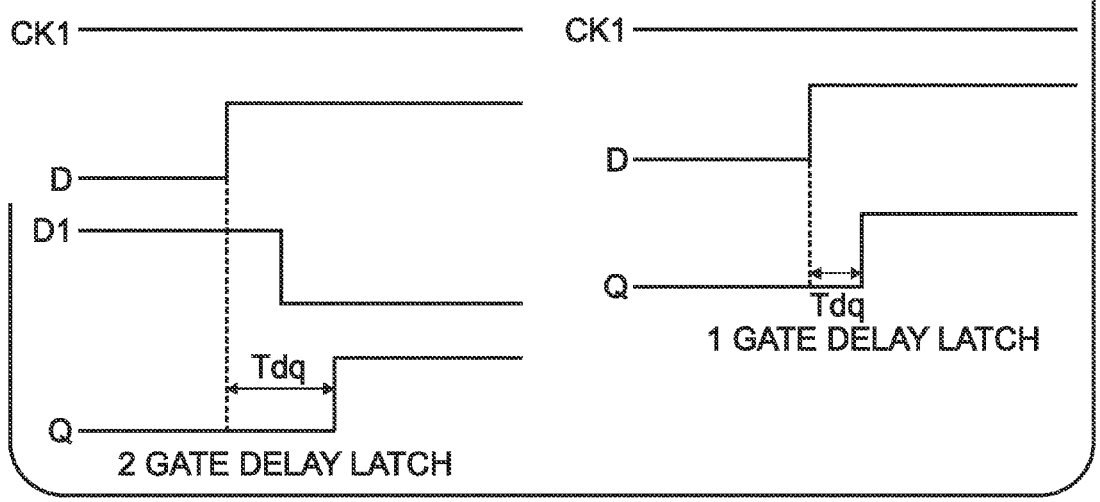
FIG. 4 is a timing diagram contrasting the differences in delay between the circuits of FIG. 2 and FIG. 3.
Figure 6:
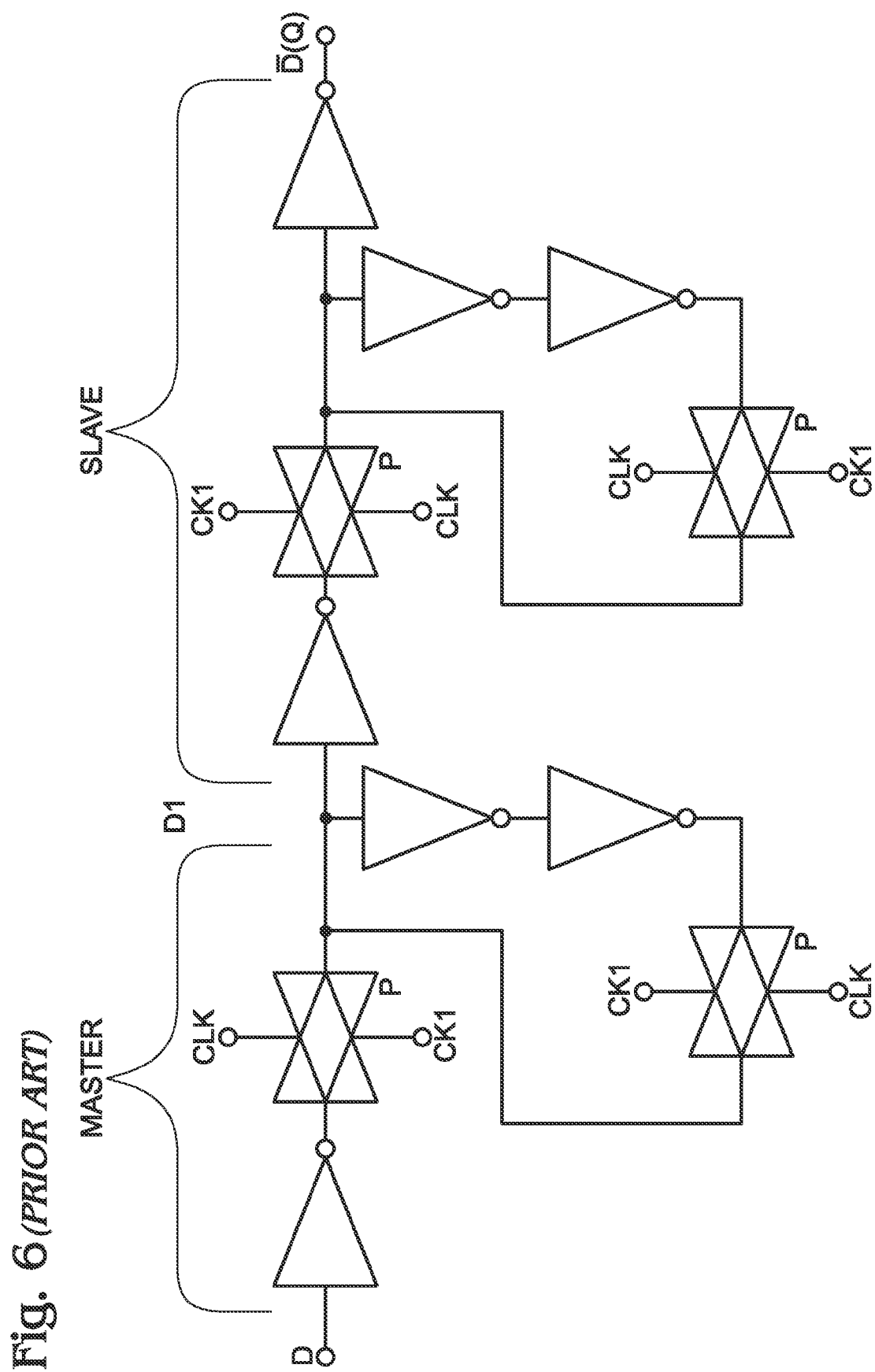
FIG. 6 is a schematic drawing of a conventional edge-triggered flip-flop using pass gates (prior art).
Figure 8:
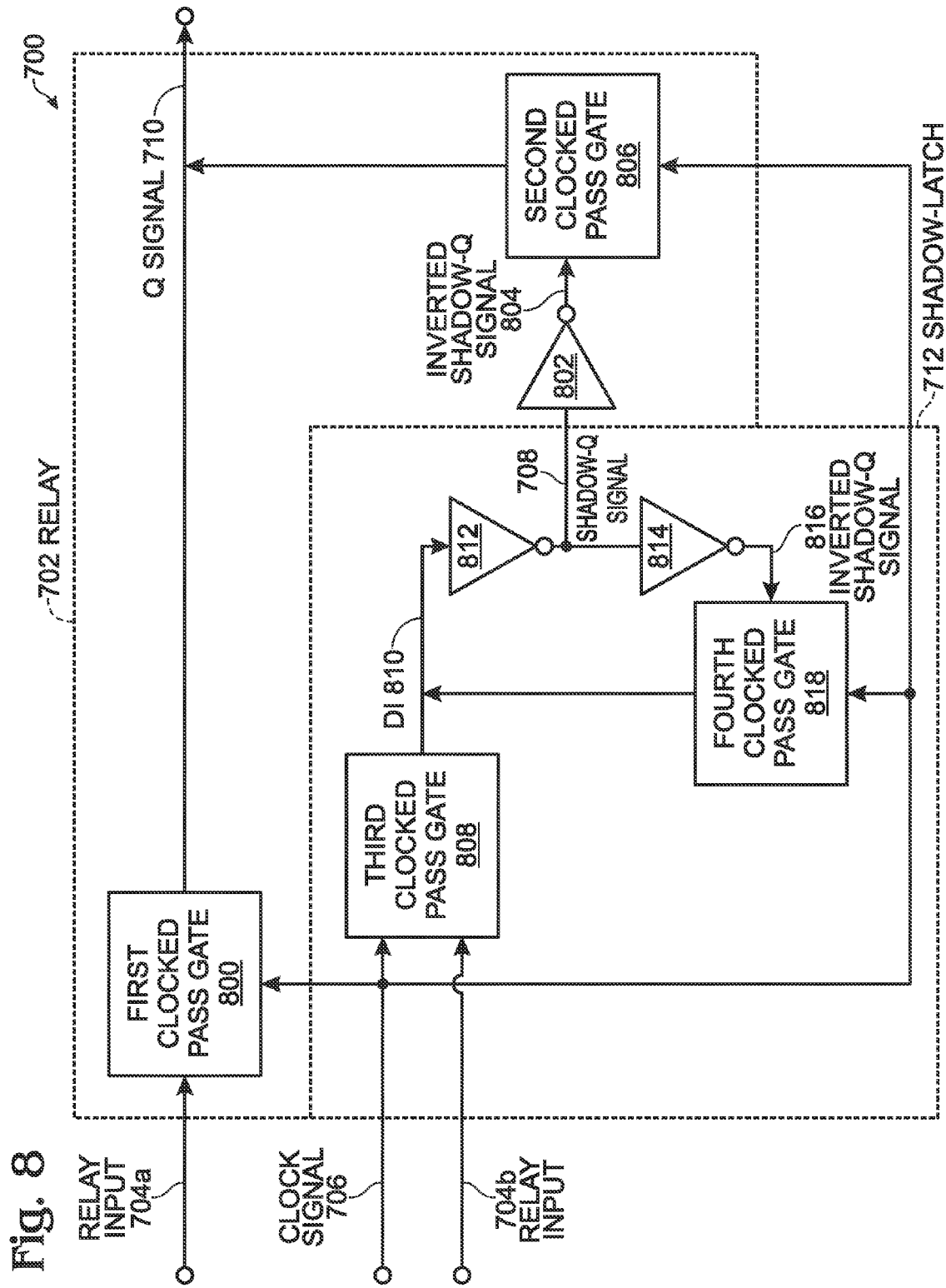
FIG. 8 is a schematic diagram depicting the latch of FIG. 7 in greater detail.

FIG. 8 is a schematic diagram depicting the latch of FIG. 7 in greater detail. The relay includes a first clocked pass gate circuit 800 having an input on line 704 to accept the relay input signal, an input on line 706 to accept the clock signal, and an output on line 710 to supply the Q signal in a pass mode. A first inverter 802 has an input on line 708 to accept the shadow-Q signal and an output on line 804 to supply an inverted shadow-Q signal. A second clocked pass gate circuit 806 has an input on line 804 to accept the inverted shadow-Q signal, an input on line 706 to accept the clock signal, and an output on line 710 to supply the Q signal in a hold mode.

The shadow latch includes a third clocked pass gate circuit 808 having an input on line 704 to accept the relay input signal, an input on line 706 to accept the clock signal, and an output on line 810 to supply a D1 signal in the pass mode. A second inverter 812 has an input on line 810 to accept the D1 signal and an output on line 708 to supply the shadow-Q signal. A third inverter 814 has an input on line 708 to accept the shadow-Q signal and an output on line 816 to supply an inverted shadow-Q signal. A fourth clocked pass gate circuit 818 has an input on line 816 to accept the inverted shadow-Q signal, an input on line 706 to accept the clock signal, and an output on line 810 to supply the D1 signal in the hold mode.

The first clocked pass gate circuit 800 supplies the Q signal in the pass mode during a first polarity of the clock signal, while the second clocked pass gate circuit 806 supplies the Q signal in the hold mode during a second polarity of the clock signal. Likewise, the third clocked pass gate circuit 808 supplies the D1 signal in the pass mode during the first polarity of the clock signal, while the fourth clocked pass gate circuit 818 supplies the D1 signal in the hold mode during the second polarity of the clock signal.

Figure 9:
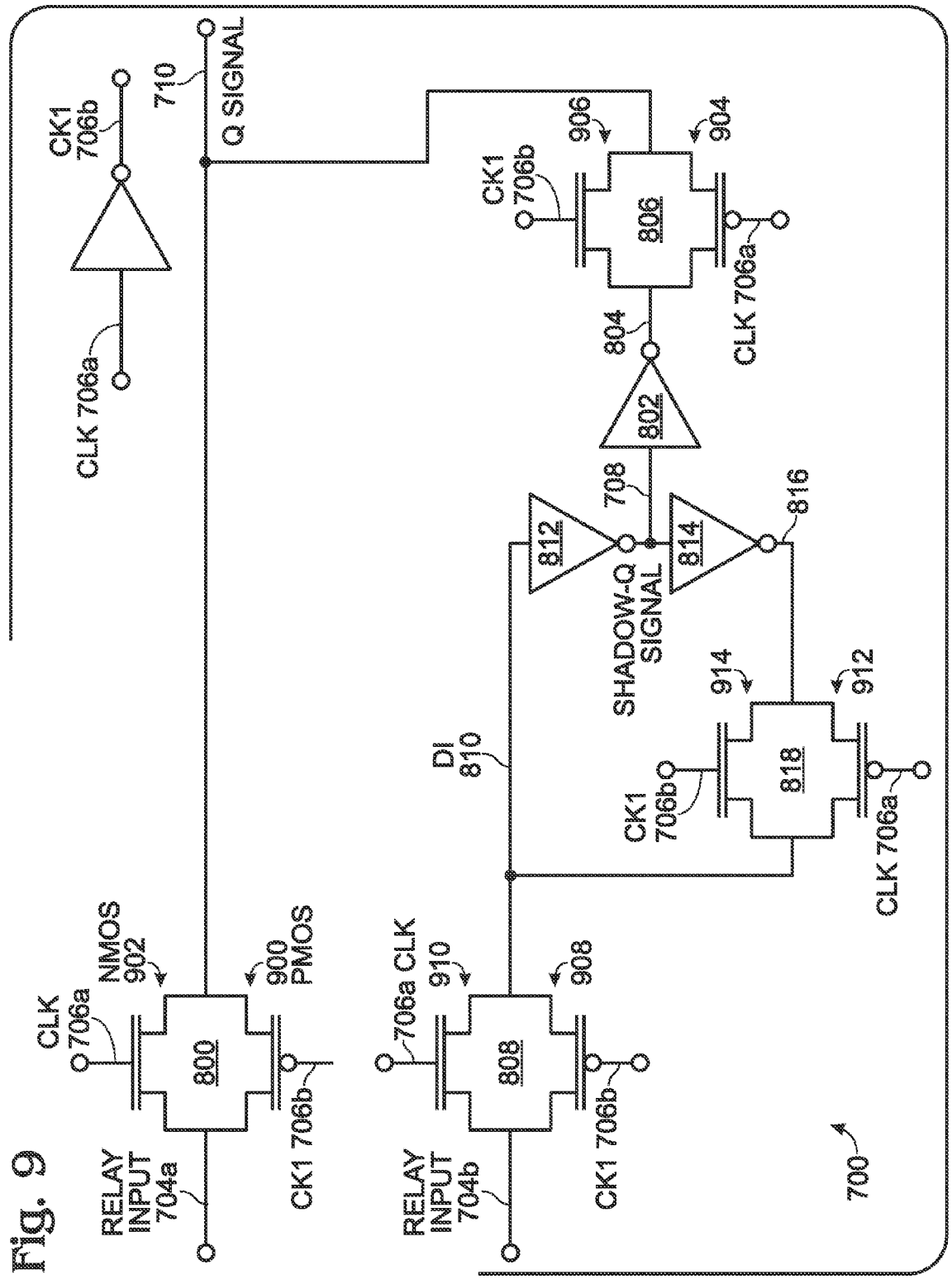
FIG. 9 is a schematic depicting the latch of FIG. 8 in greater detail.

FIG. 9 is a schematic depicting the latch of FIG. 8 in greater detail. Note: the clock signal has been further differentiated into a first phase CLK on line 706a and a second (opposite) phase CK1 on line 706b. The 180 degree clock phases may be enabled through the use of an inverter, as shown, or the two phases may be supplied by an external source. The first clocked pass gate circuit 800 includes a first PMOS field effect transistor (FET) 900 having a first source/drain (S/D) connected to the relay input signal on line 704, a second S/D connected to supply the Q signal on line 710, and a gate connected to receive an inverted clock signal (CK1) on line 706b. A first NMOS VET 902 has a first S/D connected to the first S/D of the first PMOS FET 900, a second S/D connected to the second S/D of the first PMOS FET, and a gate to receive the clock signal (CLK) on line 706a.

The second clocked pass gate circuit 806 includes a second PMOS FET 904 having a first S/D connected to receive the inverted shadow-Q signal on line 804, a second S/D to supply the Q signal, and a gate connected to receive the clock signal on line 706a. A second NMOS FET 906 has a first S/D connected to the first S/D of the second PMOS FET 904, a second S/D connected to the second S/D of the second PMOS FET, and a gate to receive the inverted clock signal on line 706b, in one aspect, the first clocked pass gate circuit 800 may be referred to as a transfer pass gate and the second clocked pass gate circuit 806 as a hold pass gate.

The third clocked pass gate circuit 808 includes a third PMOS FET 908 having a first SD connected to the relay input signal on line 704, a second S/D connected to supply the D1 signal on line 810, and a gate connected to receive an inverted clock signal on line 706b. A third NMOS FET 910 has a first S/D connected to the first S/D of the third PMOS FET 908, a second S/D connected to the second S/D of the third PMOS FET, and a gate to receive the clock signal on line 706a.

The fourth clock pass gate circuit 818 includes a fourth PMOS FET 912 having a first S/D connected to receive the inverted shadow-Q signal on line 816, a second S/D to supply the D1 signal on line 810, and a gate connected to receive the clock signal on line 706a. A fourth NMOS VET 914 has a first S/D connected to the first S/D of the fourth PMOS FET 912, a second S/D connected to the second S/D of the fourth PMOS FET, and a gate to receive the inverted clock signal on line 706b. Although not explicitly shown, the latch functions in an equivalent manner when the CLK and CK1 signals are reversed.

Figure 10:
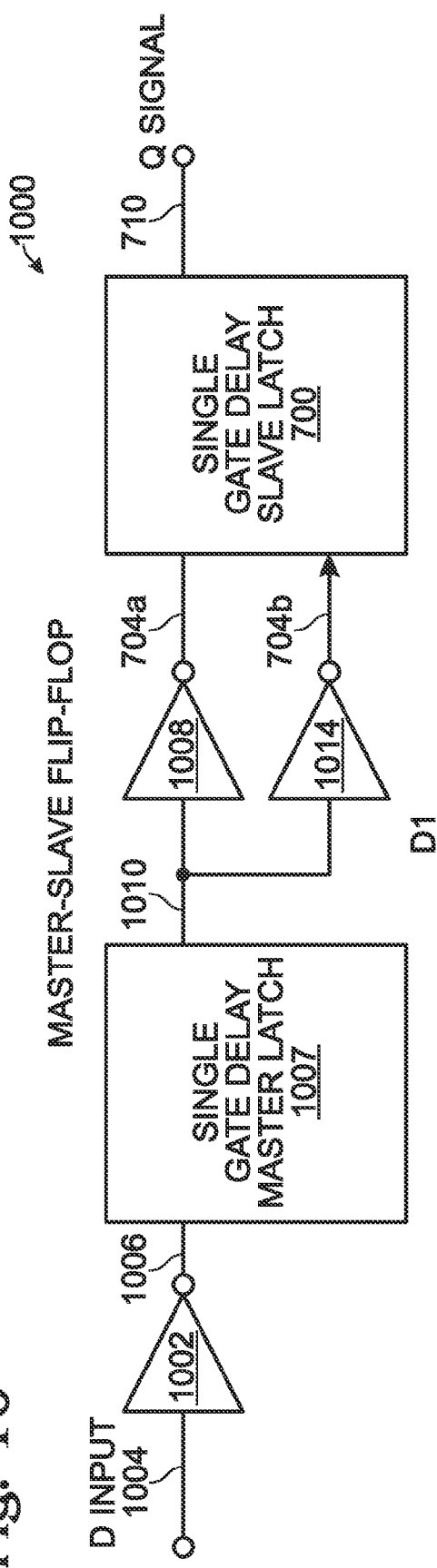
FIG. 10 is a schematic block diagram of a master-slave flip-flop.

FIG. 10 is a schematic block diagram of a master-slave flip-flop. The master-slave FF 1000 comprises a first inverter 1002 having an input on line 1004 to accept a binary first signal with a first polarity, and an output on line 1006. A single gate delay master latch 1007 has an input on line 1006 connected to the output of the first inverter 1002. In one aspect, the master latch is a clocked pass gate. A second inverter 1008 has an input on line 1010 connected to an output of the master latch 1007, and an output on line 704*a*. A third inverter 1014 has an input connected to the output of the master latch on line 1010, and an output on line 704*b*. A single gate delay slave latch 700 has inputs connected to the outputs of the second and third inverter on lines 704*a* and 704*h*, and an output on line 710 to supply a Q signal with the first polarity. Regardless of any spurious signals received at the slave latch output on line 710, a means exists for maintaining the first polarity at the slave latch output until a subsequent clock signal is received, as explained in greater detail in the explanation of FIGS. 8 and 9.

Figure 11:
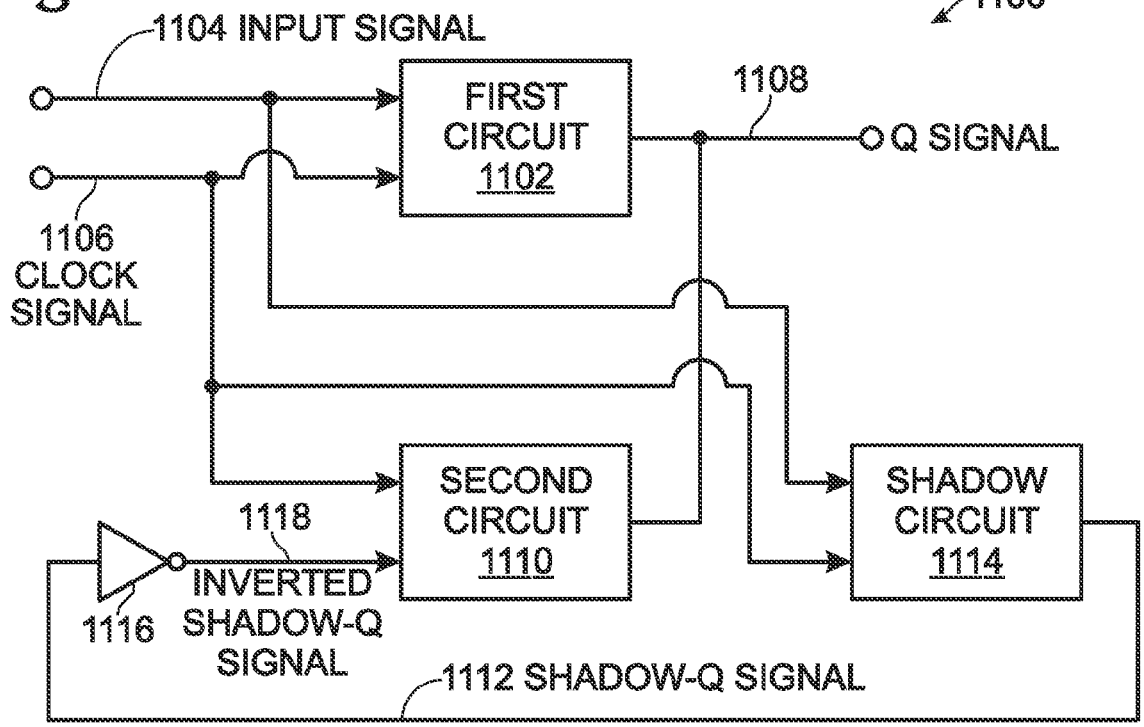
FIG. 11 is a schematic block diagram of a single gate delay latch.

FIG. 11 is a schematic block diagram of a single gate delay latch. The single gate delay latch 1100 comprises a first circuit 1102 having an interface on line 1104 to accept an input signal with a first binary state, an interface on line 1106 to accept a binary clock signal, and an interface on line 1108 to supply a Q signal with the first binary state delayed by a single gate. The first circuit 1102 maintains the Q signal first binary state during a first clock polarity. A first inverter 1116 has an input to accept the shadow-Q signal on line 1112 and an output on line 1118 to supply an inverted shadow-Q signal. A second circuit 1110 has an interface on line 1112 to accept a shadow-Q signal, and interface on line 1106 to accept the clock signal, and an interface on line 1108 to supply the Q signal. The second circuit 1110 maintains the Q signal first binary state during a second clock polarity, opposite to the first polarity. A shadow circuit 1114 has an interface on line 1104 to accept the input signal with the first binary state, an interface on line 1106 to accept the clock signal, and an interface on line 1112 to supply the shadow-Q signal.

Figure 12:
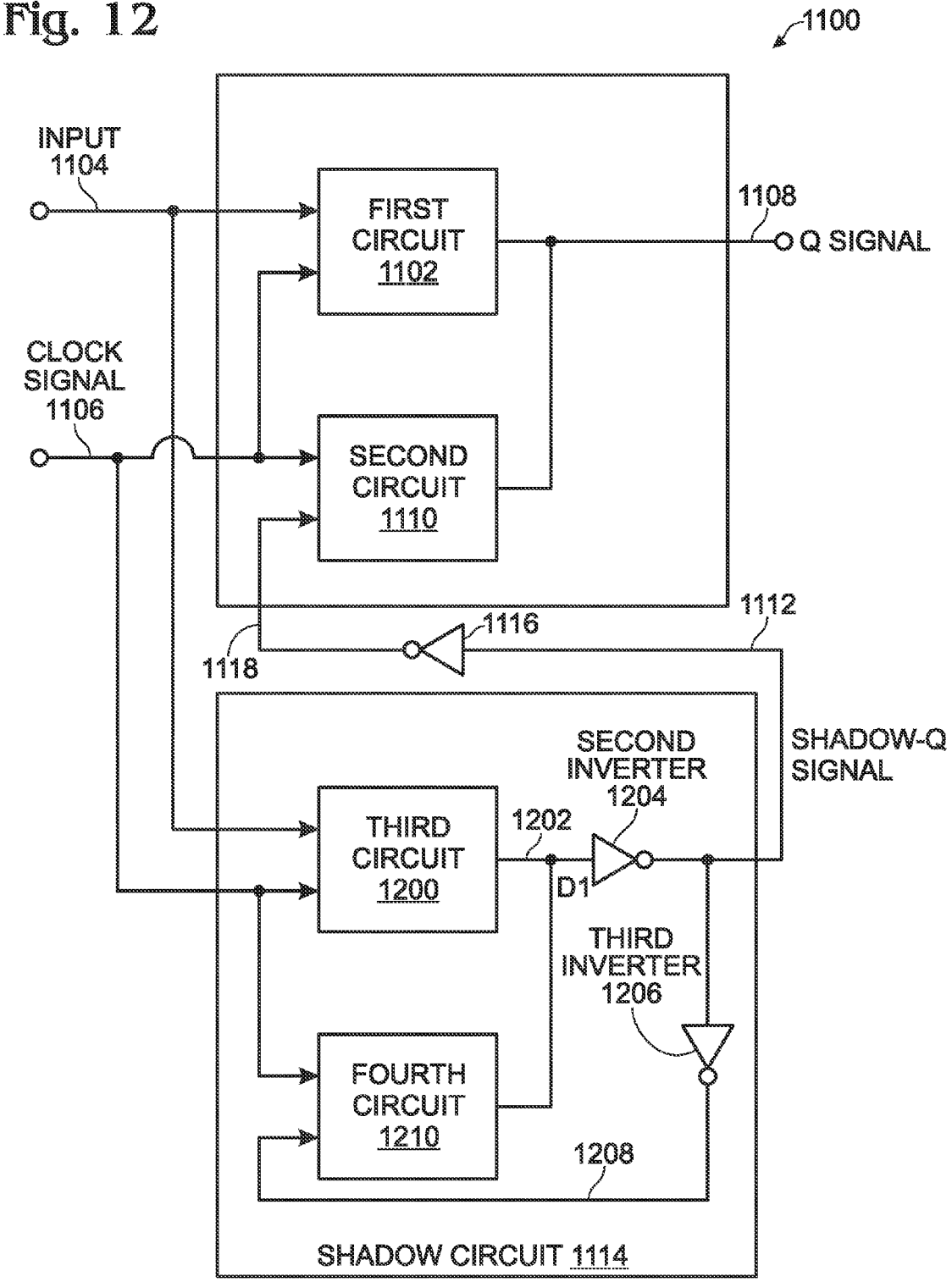
FIG. 12 is a schematic block diagram depicting the latch of FIG. 11 in greater detail.

FIG. 12 is a schematic block diagram depicting the latch of FIG. 11 in greater detail. In one aspect, the shadow circuit 1114 includes a third circuit 1200 having an interface to accept the input signal on line 1104 with the first binary state, an interface to accept the clock signal on line 1106, and an interface on line 1202 to supply a D1 signal with the first binary state, delayed by a single gate. The third circuit 1200 maintains the D1 signal first binary state during the first clock polarity. A second inverter 1204 has an input to accept the D1 signal on line 1202 and an output to supply the shadow-Q signal on line 1112. A third inverter 1206 has an input on line 1112 to accept the shadow-Q signal and an output on line 1208 to supply an inverted shadow-Q signal. A fourth circuit 1210 has an interface on line 1208 to accept the inverted shadow-Q signal, and interface on line 1106 to accept the clock signal, and an interface on line 1202 to supply the D1 signal. The fourth circuit 1210 maintains the D1 signal first binary state during the second clock polarity.

In one aspect, as shown in FIG. 9, the first circuit 1102 is a clocked pass gate (800, see FIG. 9) and the second circuit 1110 is a clocked pass gate (806). Likewise, the third circuit 1200 may be a clocked pass gate (808) and the fourth circuit 1210 may be clocked pass gate (818).

Functional Description

In this design the benefit of a faster Tdq can be achieved without losing memory state protection. This is done by duplicating the critical delay path that determines Tdq, which is half of the memory state, and using this duplication to directly drive Q. Tdq is determined by this portion of the design, and it involves a single gate delay element. Then, a master latch is built in parallel with the same D input, which holds the state of the latch. Finally, the function of opaque phase latch maintenance is duplicated, and used to drive the output. Although this duplicate path has a high latency, it is a non-critical path and does not have the same delay requirements. However, with this high latency path, memory state has been decoupled from the output, protecting the latch from dangerous coupling and/or glitch events, and making the design robust. With this design, flip-flop performance is improved from four gate delays to two, while maintaining robustness. A similar design could be enabled as a falling edge-triggered flip-flop by reversing the clock polarities.

Figure 13:
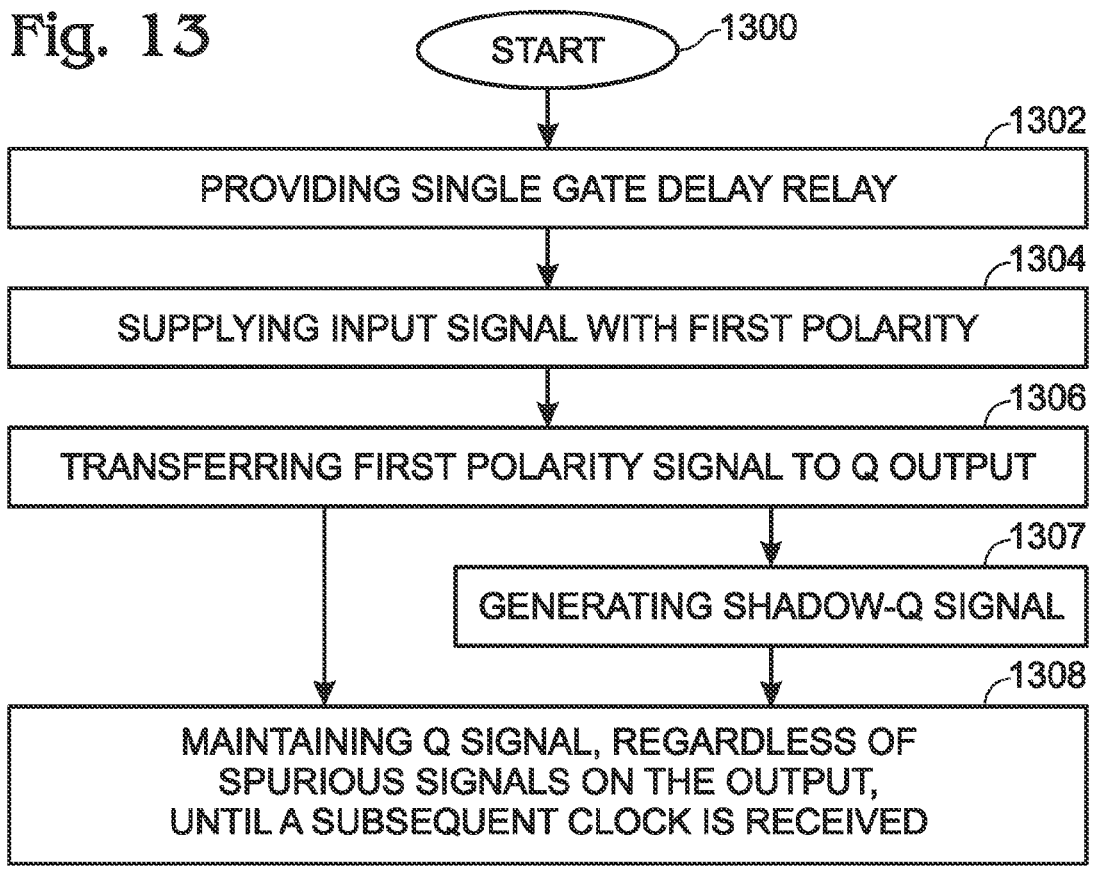
FIG. 13 is a flowchart illustrating a method for stabilizing an unbuffered latch.

FIG. 13 is a flowchart illustrating a method for stabilizing an unbuffered latch. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1300.

Step 1302 provides a single gate delay relay. Step 1304 supplies a binary relay input signal, with a first polarity value, to an input of the relay. In response to a first clock signal, Step 1306 transfers the relay input signal first polarity value to a relay (Q) output, with no more than one gate delay. Regardless of spurious signals received at the relay output, Step 1308 maintains the first polarity at the relay (Q) output until a second clock signal is received, subsequent to the first clock signal.

In one aspect, providing the relay in Step 1302 further includes providing a shadow latch. Then, Step 1307 generates a shadow-Q signal in response to the first clock signal, and maintaining the first polarity of the relay (Q) output in Step 1308 includes maintaining the first polarity in response to the shadow-Q signal. For example, Step 1307 may generate the shadow-Q signal decoupled from the relay (Q) output.

In another aspect, providing the relay and shadow latch in Step 1302 includes providing the relay with a clocked transfer pass gate output (Q) connected to a clocked hold pass gate output. Alternately stated, the transfer pass gate and hold pass gate are pass gates that are cross-coupled with respect to the clock. Likewise, the shadow latch is provided with a clocked transfer pass gate driving a clocked hold pass gate's input. Then, maintaining the first polarity of the relay (Q) output in Step 1308 includes supplying the shadow-Q signal to an input of the relay clocked hold pass gate.

A single gate delay latch has been provided. Examples of particular pass gate circuits have been presented to illustrate the invention. However, the invention is not limited to merely these examples. Other variations and embodiments of the invention will occur to those skilled in the art.

We claim:

1. A latch device comprising:
a relay having an input to accept a relay input signal, an input to accept a clock signal, an input to accept a shadow-Q signal, and an output to supply a Q signal equal to the relay input signal, the relay comprising a first inverter to accept the shadow-Q signal and supply an inverted shadow-Q signal to a first clocked pass gate circuit having an output to supply the Q signal in a hold mode; and,
a shadow latch having an input to accept the relay input signal, an input to accept the clock signal, and an output to supply the shadow-Q signal with a value equal to an inverted Q signal value.

2. The latch device of claim 1 wherein the relay comprises the first clocked pass gate circuit and a second clocked pass gate circuit having an input to accept the relay input signal, an input to accept the clock signal, and an output to supply the Q signal in a pass mode.

3. The circuit device of claim 2 wherein the shadow latch comprises:
   a third clocked pass gate circuit having an input to accept the relay input signal, an input to accept the clock signal, and an output to supply a D1 signal in the pass mode;
   a second inverter having an input to accept the D1 signal and an output to supply the shadow-Q signal;
   a third inverter having an input to accept the shadow-Q signal and an output to supply an inverted shadow-Q signal; and,
   a fourth clocked pass gate circuit having an input to accept the inverted shadow-Q signal, an input to accept the clock signal, and an output to supply the D1 signal in the hold mode.

4. The circuit device of claim 3 wherein the second clocked pass gate circuit comprises:
   a first PMOS field effect transistor (FET) having a first source/drain (S/D) connected to the relay input signal, a second S/D connected to supply the Q signal, and a gate connected to receive an inverted clock signal;
   a first NMOS FET having a first S/D connected to the first S/D of the first PMOS FET, a second S/D connected to the second S/D of the first PMOS FET, and a gate to receive the clock signal;
   wherein the first clocked pass gate circuit comprises:
      a second PMOS FET having a first S/D connected to receive the inverted shadow-Q signal, a second S/D to supply the Q signal, and a gate connected to receive the clock signal;
      a second NMOS FET having a first S/D connected to the first S/D of the second PMOS FET, a second S/D connected to the second S/D of the second PMOS FET, and a gate to receive the inverted clock signal.

5. The circuit device of claim 4 wherein the third clocked pass gate circuit comprises:
   a third PMOS FET having a first SD connected to the relay input signal, a second S/D connected to supply the D1 signal, and a gate connected to receive an inverted clock signal;
   a third NMOS FET having a first S/D connected to the first S/D of the third PMOS FET, a second S/D connected to the second S/D of the third PMOS FET, and a gate to receive the clock signal;
   wherein the fourth clocked pass gate circuit comprises:
      a fourth PMOS FET having a first S/D connected to receive the inverted shadow-Q signal, a second S/D to supply the D1 signal, and a gate connected to receive the clock signal;
      a fourth NMOS FET having a first S/D connected to the first S/D of the fourth PMOS FET, a second S/D connected to the second S/D of the fourth PMOS FET, and a gate to receive the inverted clock signal.

6. The circuit device of claim 2 wherein the second clocked pass gate circuit supplies the Q signal in the pass mode during a first polarity of the clock signal; and,
   wherein the first clocked pass gate circuit supplies the Q signal in the hold mode during a second polarity of the clock signal.

7. The circuit device of claim 3 wherein the third clocked pass gate circuit supplies the D1 signal in the pass mode during the first polarity of the clock signal; and,
   wherein the fourth clocked pass gate circuit supplies the D1 signal in the hold mode during the second polarity of the clock signal.

8. A method for stabilizing an unbuffered latch, the method comprising:
   providing a relay;
   supplying a relay input signal, with a first polarity value, to an input of the relay;
   transferring the relay input signal with the first polarity value to a relay (Q) output, with no more than one gate delay, in response to a first clock signal; and,
   maintaining the first polarity value at the relay (Q) output in response to an inverted shadow-Q signal until a second clock signal is received, subsequent to the first clock signal.

9. The method of claim 8 wherein providing the relay further comprises providing a shadow latch;
   the method further comprising:
   generating a shadow-Q signal in response to the first clock signal.

10. The method of claim 9 wherein generating the shadow-Q signal comprises generating the shadow-Q signal decoupled from the relay (Q) output.

11. The method of claim 10 wherein providing the relay and shadow latch comprises providing the relay with a clocked transfer pass gate output (Q) connected to a clocked hold pass gate output and providing the shadow latch with a clocked transfer pass gate driving a clocked hold pass gate's input; and,
   wherein maintaining the first polarity value at the relay (Q) output comprises supplying the shadow-Q signal to an input of the relay clocked hold pass gate.

12. The method of claim 8 wherein transferring the relay input signal comprises transferring the relay input signal in a pass mode during a first polarity of the first clock signal.

13. The method of claim 12 wherein transferring the relay input signal comprises transferring the relay input signal in a hold mode based on the inverted shadow-Q signal and the first clock signal.

14. The method of claim 13 wherein transferring the relay input signal in the hold mode comprises transferring the relay input signal in the hold mode during a second polarity of the first clock signal.

15. The method of claim 9 further comprising inverting the shadow-Q signal to generate the inverted shadow-Q signal.

16. A master-slave flip-flop comprising:
   a first inverter having an input to accept a binary first signal with a first polarity, and an output;
   a single gate delay master latch having an input connected to the output of the first inverter;
   a second inverter having an input connected to an output of the master latch, and an output;
   a third inverter having an input connected to the output of the master latch, and an output;
   a single gate delay slave latch having inputs connected to the outputs of the second and third inverter and an output to supply a Q signal with the first polarity; and,
   regardless of spurious signals received at the slave latch output, a means for maintaining the first polarity at the slave latch output until a subsequent clock signal is received.

17. A single gate delay latch comprising:
   a first circuit having an interface to accept an input signal with a first binary state, an interface to accept a binary clock signal, and an interface to supply a Q signal with the first binary state delayed by a single gate, the first circuit maintaining the Q signal first binary state during a first clock polarity;
   a first inverter having an input to accept a shadow-Q signal and an output to supply an inverted shadow-Q signal;

a second circuit having an interface to accept the inverted shadow-Q signal, and interface to accept the clock signal, and an interface to supply the Q signal, the second circuit maintaining the Q signal first binary state during a second clock polarity, opposite to the first polarity; and, a shadow circuit having an interface to accept the input signal with the first binary state, an interface to accept the clock signal, and an interface to supply the shadow-Q signal.

18. The latch of claim 17 wherein the first circuit is a clocked pass gate; and, wherein the second circuit is a clocked pass gate.

19. The latch of claim 17 wherein the shadow circuit comprises:

a third circuit having an interface to accept the input signal with the first binary state, an interface to accept the clock signal, and an interface to supply a D1 signal with the first binary state, delayed by a single gate, the third circuit maintaining the D1 signal first binary state during the first clock polarity;

a second inverter having an input to accept the D1 signal and an output to supply the shadow-Q signal;

a third inverter having an input to accept the shadow-Q signal and an output to supply an inverted shadow-Q signal; and, a fourth circuit having an interface to accept the inverted shadow-Q signal, and interface to accept the clock signal, and an interface to supply the D1 signal, the fourth circuit maintaining the D1 signal first binary state during the second clock polarity.

20. The latch of claim 19 wherein the third circuit is a clocked pass gate; and, wherein the fourth circuit is a clocked pass gate.

* * * * *